United States Patent
Bueb

(10) Patent No.: US 11,467,750 B2
(45) Date of Patent: Oct. 11, 2022

(54) ADJUSTABLE PHYSICAL OR LOGICAL CAPACITY CRITERIA FOR WRITE CACHE REPLENISHMENT BASED ON TEMPERATURE OR PROGRAM ERASE CYCLES OF THE MEMORY DEVICE

(71) Applicant: Micron Technology, Inc., Boise, ID (US)

(72) Inventor: Christopher J. Bueb, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/000,066

(22) Filed: Aug. 21, 2020

(65) Prior Publication Data

US 2022/0057952 A1 Feb. 24, 2022

(51) Int. Cl.
*G06F 3/06* (2006.01)
*G01K 3/00* (2006.01)
*G11C 16/34* (2006.01)
*G11C 16/04* (2006.01)

(52) U.S. Cl.
CPC .......... *G06F 3/0647* (2013.01); *G01K 3/005* (2013.01); *G06F 3/0604* (2013.01); *G06F 3/0653* (2013.01); *G06F 3/0659* (2013.01); *G06F 3/0679* (2013.01); *G11C 16/0483* (2013.01); *G11C 16/349* (2013.01)

(58) Field of Classification Search
CPC .... G06F 3/0647; G06F 3/0604; G06F 3/0653; G06F 3/0659; G06F 3/0679; G06F 3/0614; G06F 12/08; G01K 3/005; G11C 16/0483; G11C 16/349; G11C 16/3418; G11C 2211/5641; G11C 7/04
USPC .......................... 711/103, 113, 203; 365/211
See application file for complete search history.

(56) References Cited

U.S. PATENT DOCUMENTS

| | | | |
|---|---|---|---|
| 10,572,388 B2 * | 2/2020 | Christensen | G06F 3/0679 |
| 2012/0297121 A1 * | 11/2012 | Gorobets | G06F 12/0246 |
| | | | 711/E12.008 |
| 2018/0121131 A1 * | 5/2018 | Vogan | G11C 7/04 |
| 2019/0013079 A1 * | 1/2019 | Blodgett | G06F 1/3275 |
| 2019/0369899 A1 * | 12/2019 | Tanpairoj | G06F 3/0647 |
| 2019/0377681 A1 * | 12/2019 | Hodes | G06F 12/0871 |
| 2020/0192595 A1 * | 6/2020 | Fisher | G06F 3/0619 |

\* cited by examiner

*Primary Examiner* — Hong C Kim
(74) *Attorney, Agent, or Firm* — Lowenstein Sandler LLP

(57) ABSTRACT

A temperature reading from a thermal sensor connected to a memory device is determined. The memory device comprises a plurality of memory cells. At least one of a logical capacity criterion or a physical capacity criterion is determined based on the temperature reading from the thermal sensor. Responsive to determining that at least one of the logical capacity of a first data block of the plurality of memory cells configured as a first memory type satisfies the logical capacity criterion or a physical capacity of the first data block of the plurality of memory cells configured as the first memory type satisfies the physical capacity criterion, data from the first data block is migrated to a second data block of the plurality of memory cells configured as a second memory type.

17 Claims, 5 Drawing Sheets

200

```
┌─────────────────────────────────────────────────────────────────┐
│ Determine a temperature reading from a thermal sensor connected │
│                        to a memory device.                      │
│                              210                                │
└─────────────────────────────────────────────────────────────────┘
                                │
                                ▼
┌─────────────────────────────────────────────────────────────────┐
│ Determine at least one of a logical capacity criterion or a     │
│ physical capacity criterion based on the temperature reading    │
│                     from the thermal sensor.                    │
│                              220                                │
└─────────────────────────────────────────────────────────────────┘
                                │
                                ▼
┌─────────────────────────────────────────────────────────────────┐
│ Responsive to determining that at least one of a logical        │
│ capacity of a first data block of the plurality of memory cells │
│ configured as a first memory type satisfies the logical         │
│ capacity criterion or a physical capacity of the first data     │
│ block of the plurality of memory cells configured as the first  │
│ memory type satisfies the physical capacity criterion,          │
│ migrating data from the first data block of the plurality of    │
│ memory cells configured as the first memory type to a second    │
│ data block of the plurality of memory cells configured as a     │
│ second memory type.                                             │
│                              230                                │
└─────────────────────────────────────────────────────────────────┘
```

```
┌─────────────────────────────────────────────────────────────┐
│  Receive a temperature reading from a thermal sensor connected │
│                     to a memory device                      │
│                            310                              │
└─────────────────────────────────────────────────────────────┘
                              │
                              ▼
┌─────────────────────────────────────────────────────────────┐
│  Determine a number of program/erase (PE) cycles associated with the │
│                        memory device                        │
│                            320                              │
└─────────────────────────────────────────────────────────────┘
                              │
                              ▼
┌─────────────────────────────────────────────────────────────┐
│  Determine a capacity criterion based on at least one of the temperature │
│  reading or the number of PE cycles, wherein the capacity criterion comprises │
│     a physical capacity parameter and a logical capacity parameter     │
│                            330                              │
└─────────────────────────────────────────────────────────────┘
                              │
                              ▼
┌─────────────────────────────────────────────────────────────┐
│  Transmit the capacity criterion to a memory sub-system comprising the │
│                        memory device                        │
│                            340                              │
└─────────────────────────────────────────────────────────────┘
```

FIG. 3

ADJUSTABLE PHYSICAL OR LOGICAL CAPACITY CRITERIA FOR WRITE CACHE REPLENISHMENT BASED ON TEMPERATURE OR PROGRAM ERASE CYCLES OF THE MEMORY DEVICE

TECHNICAL FIELD

Embodiments of the disclosure relate generally to memory sub-systems, and more specifically, relate to adjustable parameters for write cache replenishment in a memory device to extend cross-temperature operation capacity.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a flow diagram of an example method to adjust parameters for write cache replenishment in accordance with some embodiments of the present disclosure.

FIG. 3 is a flow diagram of another example method to adjust parameters for write cache replenishment in accordance with some embodiments of the present disclosure.

DETAILED DESCRIPTION

Figure 1:
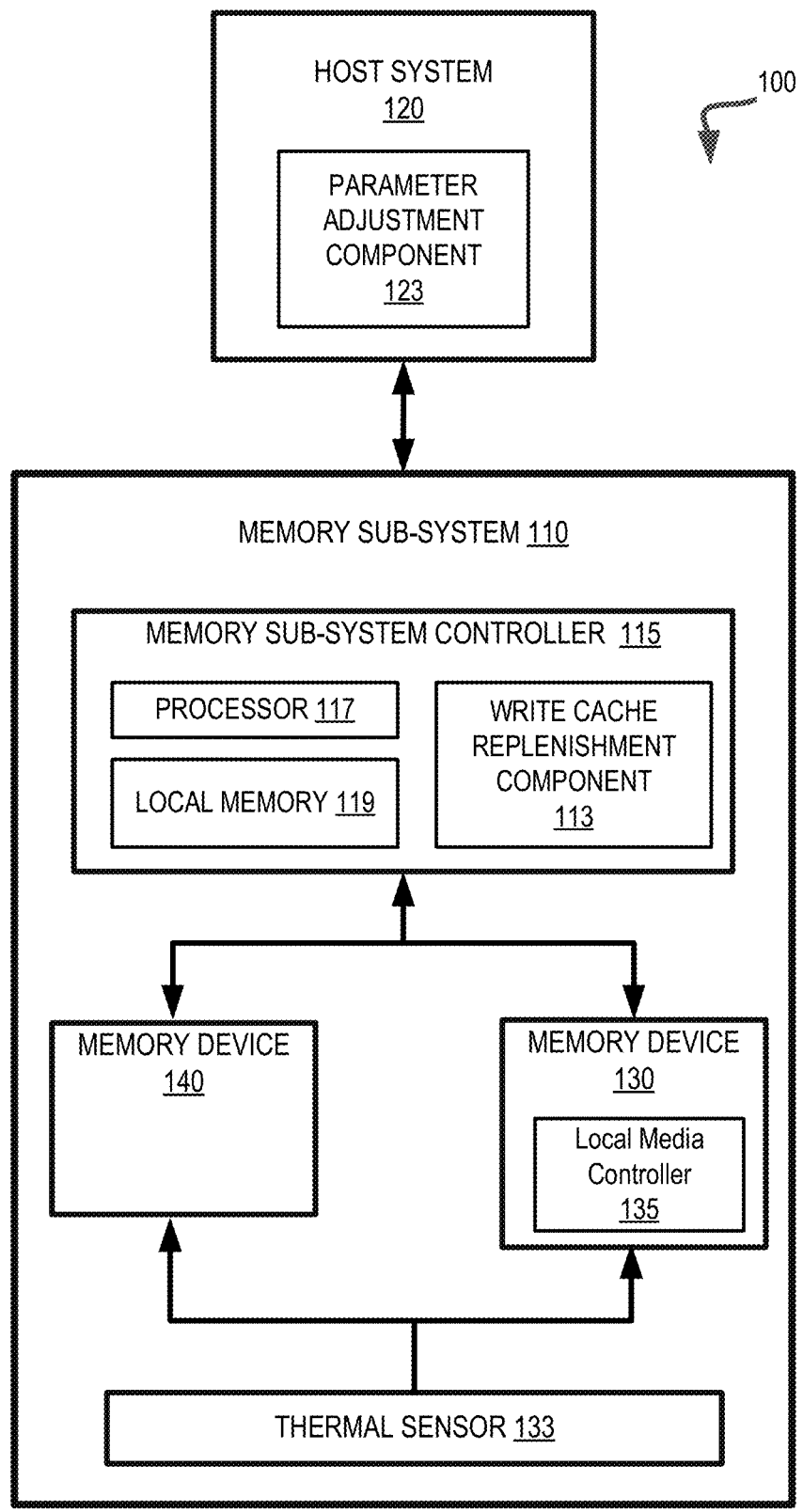
FIG. 1 illustrates an example computing system that includes a memory sub-system in accordance with some embodiments of the present disclosure.

Aspects of the present disclosure are directed to adjustable parameters for write cache replenishment in a memory device to extend cross-temperature operational capacity. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data density corresponds to an amount of data (e.g., bits of data) that can be stored per memory cell of a memory device. In one example, a block of the memory system can be configured as single-level-cell (SLC) memory where each memory cell of the SLC memory can be programmed with a single bit of data. Other data blocks in the memory system can be configured as higher density memory, such as multi-level cell (MLC) memory that is programed by storing two bits per memory cell, tri-level cell (TLC) memory that is programmed by storing three bits per memory cell, quad-level cell (QLC) memory that is programmed by storing four bits per memory cell, or penta-level cell (PLC) memory that is programmed by storing five bits per memory cell.

Despite the smaller capacity and lower density of SLC memory, its benefits include superior performance and reliability compared to MLC/TLC/QLC/PLC memory. Read time and program (e.g., write) time for SLC memory is faster than that of MLC/TLC/QLC/PLC memory. The host system can experience less latency in its performance if data from the host system is written to SLC memory. Thus, systems often configure a fixed portion of the memory as SLC memory (i.e., an SLC cache). These systems operate by initially writing all data associated with any memory write commands received from the host system to data blocks configured as SLC memory and later migrate that data to MLC/TLC/QLC/PLC memory.

Migrating data from one location of the memory sub-system to another location is sometimes known as folding. As the SLC cache fills up, data can be migrated or folded to higher density memory cells in order to replenish the SLC cache. Migrating data from SLC memory to MLC/TLC/QLC/PLC memory involves moving data from one granulation (e.g., one bit per cell) to another granulation (e.g., multiple bits per cell). For example, migrating data from an SLC memory to QLC memory involves fitting data from four SLC memory cells to one QLC memory cell. Migrating data to free up space on the SLC cache is desirable because the SLC response time can decrease as the SLC fills up. Conventional systems generally employ static migrating (or folding) thresholds to determine when to migrate data from SLC cache to higher density memory cells. These static migrating (or folding) thresholds do not take into account the temperature or the amount of wear of the memory devices on which the data is being migrated. Temperature and amount of wear of the memory devices, however, are key reliability factors. Write reliability is reduced when the write operations are executed at extremely hot or extremely cold temperatures. Furthermore, write reliability is reduced when the media on which the write commands are executed becomes worn with a high number program/erase (PE) cycles.

Aspects of the present disclosure address the above and other deficiencies by having a memory sub-system that uses adjustable parameters for write cache replenishment in a memory device. The memory sub-system includes a memory sub-system controller that can migrate, or fold, data from the SLC cache to higher density memory cells (e.g., memory configured as TLC or QLC). When the memory sub-system is idle (e.g., when the command queue is empty), the controller can determine the temperature of a memory device within the memory sub-system, and depending on the temperature, can determine capacity thresholds at which to migrate the data from SLC cache to higher density memory cells. For example, when the memory sub-system controller determines that the memory device is running at a nominal temperature (e.g., room temperature), the controller can determine to migrate the data from SLC to QLC when the SLC cache reaches a certain capacity (the logical capacity and/or the physical capacity). However, if the memory device is running at an extreme temperature (e.g., above or below specific temperature thresholds), the controller can determine to migrate the data from SLC to QLC when the SLC cache reaches a higher capacity threshold, thus avoiding writing data at extreme temperatures.

In some embodiments, the host system can adjust the temperature and capacity threshold values. For example, the host system can determine that, based on tracked historical temperature readings, the memory device generally does not exceed or fall below certain temperatures. As such, the host system can base the extreme temperature threshold values on the historically observed temperature readings. Furthermore, the host system can determine that a memory device within the memory sub-system is approaching a high number of PE cycles, and can adjust the temperature and capacity threshold values to minimize additional PE cycles.

Advantages of the present disclosure include, but are not limited to, more efficient usage of the logical capacity of a memory device, which can lead to increase capacity, less write amplification, and longer device life. Additionally, aspects of the present disclosure leverage firmware to improve the overall usability of the device, and provide a firmware solution that enables customization and works cohesively with hardware enhancements that are optimized for the same end-user benefit. Aspects of the present disclosure augment the cache replenishment when reliability conditions are more favorable, and replenish write cache only as necessary when reliability conditions are less favorable. This can lead to increased data reliability and extended lifespan of the memory devices.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

In one embodiment, the host system 120 includes a parameter adjustment component 123 that can determine one or more capacity threshold values at which the memory sub-system 110 will migrate data from the SLC write cache to higher density memory cells, for example within memory device 130. The parameter adjustment component 123 can receive temperature readings from the memory sub-system 110, indicating the temperature at which the memory sub-system 110 and/or individual memory devices 130, 140 are running. The parameter adjustment component 123 can also receive information about the amount used of the SLC cache portion of the memory device 130, and the number of PE cycles that have been executed on the memory device 130. In some embodiments, the parameter adjustment component 123 can keep track of the number of PE cycles and/or the temperature readings. The parameter adjustment component 123 can receive more information from the memory sub-system, including whether the system is idle. Based on the current temperature of the memory sub-system, the PE cycles, the historical temperature of the memory sub-system, and/or whether the system is idle, the parameter adjustment component 123 can set the capacity thresholds at which the memory sub-system 110 will migrate data from SLC write cache to higher density memory cells, e.g., to memory cells configured as QLC within memory device 130. The parameter adjustment component 123 can transmit the capacity threshold to memory sub-system controller 115.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a write cache replenishment component 113 that can determine one or more capacity threshold values at which data will be migrated from the SLC write cache to higher density memory cells, for example to memory cells configured as QLC within memory device 130. In some embodiments, the memory sub-system controller 115 includes at least a portion of the write cache replenishment component 113. In some embodiments, the write cache replenishment component 113 is part of the host system 110, an application, or an operating system. In other embodiments, local media controller 135 includes at least a portion of write cache replenishment component 113 and is configured to perform the functionality described herein.

The write cache replenishment component 113 can determine the temperature at which the memory sub-system 110 is running based on a reading from a thermal sensor 133 connected to or located near one or more memory devices (130, 140) within the memory sub-system. The write cache replenishment component 113 can use the temperature reading (including historical temperature readings), the available capacity of the SLC write cache, and whether the memory sub-system is idle to determine when to migrate data from the SLC cache to higher density memory cells, e.g., memory cells configured as QLC.

It can be desirable not to migrate data from SLC cache to higher density memory cells until the SLC has reached a minimum capacity level. Data associated with a write command received from the host system can be initially written to the SLC cache in order to take advantage the high performance and reliability of the SLC memory. Additionally, there is a high likelihood that data written to the SLC cache will be overwritten by the host system. This phenomenon is sometimes referred to as temporal locality. Data having temporal locality is data that a processing device tends to access at the same memory locations repetitively over a short period of time, e.g., data written, over-written, and trimmed around the same time. Hence, the write cache replenishment component 113 can set a minimum capacity threshold at which to migrate data to higher density memory cells. Migrating data too soon can result in negating the benefits of the higher performance and reliability of SLC.

Migrating data from one type of memory (e.g., memory cells configured as SLC) to another type of memory (e.g., memory cells configured as QLC) can involve reading the data stored on the first type of memory (e.g., memory cells configured as SLC) and writing the data to the second type of memory (e.g., memory cells configured as QLC). The reliability of data can be affected by a number of parameters, including the temperature at which the data is written, and the wear on the memory device on which the data is written. Hence, write cache replenishment component 113 can adjust the capacity thresholds at which to migrate data based on the temperature of the memory sub-system 110 (and/or of each memory device 130), and on the level of wear of the memory devices 130.

Furthermore, migrating data can cause latency within the memory sub-system 110, which can extend into latency experienced by the host system 120. As such, the write cache replenishment component 113 can adjust the capacity at which to migrate data from SLC cache to higher density memory cells based on whether the memory sub-system is idle. That is, if the memory sub-system is idle, i.e., the command queue associated with the memory sub-system is empty, the write cache replenishment component 113 can determine to migrate data when the SLC memory has reached a first capacity threshold value. However, if the command queue is not empty (i.e., the memory sub-system is not idle), the write cache replenishment component 113 can determine a higher capacity threshold value at which to migrate data from the SLC cache to higher density memory cells, in order to reduce system latency. When data is migrated while the system is not idle, operations received from the host 120 can be interrupted in order to complete data migration. The write cache replenishment component 113 can determine to hold off migrating data while the system is not idle for as long as possible, especially when the memory sub-system is running at an extreme temperature. The write cache replenishment component 113 can also take into account the historical temperature readings from the thermal sensor 113 in deciding whether the memory device 130 is running at an extreme temperature. Furthermore, the write cache replenishment component 113 can adjust the capacity threshold(s) based on the level of wear experienced by the memory device 130 (e.g., the number of PE cycles), in order to reduce additional wear on the device.

As the memory device 130 ages, the memory cells within memory device 130 undergo many program-erase cycles (PE cycles). The number of PE cycles refers to the number of times a group of memory cells is erased and subsequently programmed with new data. The write cache replenishment component 113 can keep track of the number of PE cycles, e.g., within local memory 119. Additionally or alternatively, the parameter adjustment component 123 can keep track of the number of PE cycles.

In various embodiments, the write cache replenishment component 113 and/or the parameter adjustment component 123 can determine whether the number of PE cycles satisfies a threshold criterion, such as being greater than or equal to a threshold number of PE cycles. Satisfying the threshold criterion can indicate to the write cache replenishment component 113 and/or the parameter adjustment component 123 that the memory device has experienced significant wear, and further write operations should be reduced in order to enhance write reliability. The threshold number of PE cycles can be, for example, 500, 1,000, 5,000, or some other value In some embodiments, the write cache replenishment component 113 can send status information to the parameter adjustment component 123, such as the temperature readings of thermal sensor 133, the number of PE cycles executed on the memory device 130, and/or the available capacity or used capacity within the SLC cache. Additionally or alternatively, the parameter adjustment component 123 can keep track of the availability capacity or used capacity of the SLC cache, the level of wear experienced by the memory device (e.g., the number of PE cycles), and/or the temperature readings from thermal sensor 133. The parameter adjustment component 123 can then determine the capacity threshold value(s) at which the write cache replenishment component 113 can migrate data from SLC cache to higher density memory cells. Further details with regards to the operations of the write cache replenishment component 113 and the parameter adjustment component 123 are described below.

FIG. 2 is a flow diagram of an example method 200 to adjust parameter for write cache replenishment, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the write cache replenishment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic can determine the temperature of the memory device based on a temperature reading from a thermal sensor connected to the memory device. In some embodiments, the processing logic can track the temperature readings from the thermal sensor and determine a range in which the memory device usually runs. Based on the tracked temperature readings, the processing logic can determine a maximum temperature at which the memory device runs and minimum temperature at which the memory device runs. These maximum and minimum values can then be used in setting the temperatures at which the processing logic can migrate the data.

At operation 220, the processing logic determines at least one of a logical capacity criterion or a physical capacity criterion based on the temperature reading from the thermal sensor. In some embodiments, the processing logic can receive the capacity criterion and/or the physical criterion from the host system.

When determining the logical and/or physical criteria, the processing logic can adjust the criteria based on whether the memory device is running at an extreme temperature. That is, the processing logic can determine whether the temperature reading from the thermal sensor connected to the memory device exceeds a first temperature threshold or falls below a second temperature threshold. For example, the processing logic can determine that the memory device is running at an extremely hot temperature if it exceeds 85 degrees Celsius, and the processing logic can determine that the memory device is running at an extremely low temperature if it falls below minus 10 degrees Celsius. The processing logic can determine that the memory device is running at a nominal temperature the temperature reading falls between minus 10 degrees Celsius and 85 degrees Celsius. These temperature threshold values can be adjusted based on historical temperature readings of the memory device, or based on data received from the host system. The temperature threshold values are not limited to the examples provided herein.

It should be noted that some memory devices are optimized to function at nominal and hot temperatures, and that running at extremely low temperatures lowers write reliability. In such cases, the processing logic can consider only whether the temperature reading falls below a low temperature threshold value (e.g., minus 10 degrees Celsius). In some embodiments, because writing data at cold temperatures is generally to be avoided, the host system and/or the memory sub-system may wait until a certain amount of (e.g., two minutes) time after power-on before migrating data in order to give the system a chance to reach a nominal temperature. Furthermore, when a memory device is running at an extremely hot temperature, the processing logic can determine to reduce heat generating operations such as data migration to allow the memory device the chance to cool down. Hence, the processing logic can set the maximum temperature threshold value accordingly.

Prior to migrating the data, the processing logic can determine whether the system is idle. That is, the processing logic can adjust the capacity criteria at which the processing logic can migrate data based on whether the system is idle. When the system is idle (i.e., the command queue associated with the memory device is empty), the processing logic can execute the data migration in the background. Hence, in response to determining that the command queue is empty and that the memory device is running at an extreme temperature, the processing logic can set the logical capacity criterion to a first logical capacity threshold value, and/or can set the physical capacity criterion to a first physical capacity threshold value.

When the system is not idle (i.e., the command queue is not empty), the processing logic can interrupt the commands received from the host system in order to migrate data. This interruption can result the host commands experiencing high latency. To avoid this increased latency, the processing logic can adjust the logical and/or physical criteria and delay migrating the data. Hence, in response to determining that the command queue is not empty and that the memory device is running at an extreme temperature, the processing logic can set the logical capacity criterion to a second logical capacity threshold value, and/or can set the physical capacity criterion to a second physical capacity threshold value. The second logical capacity threshold value can exceed the first logical capacity threshold value and the second physical capacity threshold value can exceed the second physical capacity threshold value.

The processing logic can perform similar operations when the memory device is not running at an extreme temperature. For example, if the temperature reading from the thermal sensor is a nominal temperature (e.g., between minus 10 degrees Celsius and 85 degrees Celsius), the processing logic can set the logical capacity criterion to a third logical capacity threshold value and/or can set the physical capacity criterion to a third physical threshold value if the system is idle. Additionally or alternatively, if the temperature reading from the thermal sensor is a nominal temperature (e.g., between minus 10 degrees Celsius and 85 degrees Celsius), the processing logic can set the logical capacity criterion to a fourth logical capacity threshold value and/or can set the physical capacity criterion to a fourth physical capacity threshold value if the system is not idle. The third logical and third physical capacity criteria can fall below the other capacity criteria. The fourth logical and fourth physical capacity criteria can be higher than the first logical and first physical capacity criteria, and lower than the second logical and second physical capacity criteria.

That is, in some embodiments, the processing logic can determine to migrate data on an idle memory device running at a nominal temperature at the lowest logical and/or physical capacity threshold values; migrate data on an idle memory device running at an extreme temperature at the next lowest logical and/or physical capacity threshold values; migrate data on an idle memory device running at an extreme temperature at the next lowest logical and/or physical capacity threshold values; and finally migrate data on a not idle memory device running at an extreme temperature at the highest logical and/or physical capacity threshold values. In some embodiments, the processing logic can wait until the SLC cache is completely fully before migrating data on a non-idle memory device that is running at an extreme temperature.

In some embodiments, the processing logic can determine a maximum physical capacity and/or a maximum logical capacity of the memory device. For example, the memory sub-system and/or the host can dedicate an amount of memory cells on the memory device to overprovisioning. This amount of capacity is not available to the user. The logical capacity criterion and the physical capacity criterion can be adjusted based on the maximum physical capacity and maximum logical capacity of the device.

At operation 230, the processing logic determine whether at least one of the logical capacity of a first data block of the memory cells configured as a first memory type (e.g., configured as SLC) satisfies the logical capacity criterion, or the physical capacity of the first data the memory device of the memory cells configured as a first memory type (e.g., configured as SLC) satisfies the physical capacity criterion. That is, the processing logic determines whether the SLC cache has reached the capacity at which the memory sub-system controller will migrate the data from SCL to higher density memory cells (e.g., QLC). Responsive to determining that at least one of the logical capacity or the physical capacity of the SLC cache satisfies the respective capacity criterion, the processing logic can migrate data from the first data block configured as the first memory type (e.g., configured as SLC) to the second data block of the memory cells configured as a second memory type (e.g., configured as QLC).

Once the processing logic has determined to migrate the data, it can continue doing so until the logical capacity and/or physical capacity of the SLC cache has reached a minimum level. That is, in response to determining that the logical capacity of SLC cache falls below the logical capacity threshold value and the physical capacity of the SLC cache falls below the physical capacity threshold, the processing logic can stop migrating the data from the SLC to the higher density memory cells (e.g., configured as QLC). This can help ensure temporal locality of the data associated with write commands received from the host system.

FIG. 3 is a flow diagram of an example method 300 to adjust parameters for write cache replenishment in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the parameter adjustment component 123 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic can receive a temperature reading from a thermal sensor connected to a memory device. In some embodiments, the processing logic can track the temperature readings from the thermal sensor and determine a range in which the memory device usually runs. Based on the tracked temperature readings, the processing logic can determine a maximum temperature at which the memory device runs and minimum temperature at which the memory device runs. These maximum and minimum values can then be used in setting the temperatures at which the processing logic can migrate the data.

At operation 320, the processing logic can determine a number of program/erase (PE) cycles associated with the memory device. In some embodiments, the processing logic can keep track of the PE cycles. Additionally or alternatively, the processing logic can receive the number of PE cycles from the memory sub-system. The number of PE cycles refers to the number of times a group of memory cells is erased and subsequently programmed with new data. As the number of PE cycles increases, write commands (including data migration) should be reduced to avoid additional wear on and to extend the life of the memory device.

At operation 330, the processing logic can determine a capacity criterion based on at least one of the temperature reading or the number of PE cycles. The capacity criterion can include a physical capacity parameter and/or a logical capacity parameter.

In some embodiments, the processing logic can base the capacity criterion on the temperature reading from the thermal sensor. The processing logic can determine that the memory device is running at an extreme temperature, e.g., that the temperature reading from the thermal sensor is above a first "hot" temperature threshold or below a second "cold" temperature threshold. Additionally, the processing logic can determine whether the memory system is idle by determining whether the command queue is empty.

In response to determining that the command queue is empty, the processing logic can set the physical capacity parameter to a first physical capacity threshold and/or the logical capacity parameter to a first logical capacity threshold. In response to determining that the command queue is not empty, the processing logic can set the physical capacity parameter to a second physical capacity threshold and/or the logical capacity parameter to a second logical capacity threshold. The second capacity thresholds can be higher than the first capacity thresholds in order to delay migrating data when the command queue is not empty, thus avoiding excessive latency.

Additionally or alternatively, the processing logic can base on the capacity criterion on the amount of wear on the memory device (e.g., the number of PE cycles). The processing logic can determine whether the number of PE cycles satisfies a threshold criterion, such as being greater than or equal to a threshold number of PE cycles. Satisfying the threshold criterion can indicate that the memory device has experienced significant wear, and further write operations should be reduced in order to enhance write reliability. The threshold number of PE cycles can be, for example, 500, 1,000, 5,000, or some other value.

In response to determining that the number of PE cycles exceeds the PE cycle threshold value, the processing logic can set the physical capacity parameter to a third physical capacity threshold and/or the logical capacity parameter to a third logical capacity threshold.

Additionally or alternatively, the processing logic can adjust the capacity criterion based on the maximum capacity of the memory device, taking into account the memory cells reserved for overprovisioning. In some embodiments, the processing device can take into account the maximum capacity of the memory device, the number of PE cycles, and the temperature of the memory device when setting the capacity criterion.

At operation 340, the processing logic can transmit the capacity criterion to the memory sub-system housing the memory device. The memory sub-system can then use the capacity criterion to determine whether to migrate data from the SLC cache to higher density memory cells (e.g., QLC). In some embodiments, the processing logic can determine the logical and/or physical capacity of the SLC cache and determine whether the capacity criterion is satisfied. Based on that determination, the processing logic can send one or more commands to the memory sub-system to replenish the SLC cache, i.e., to migrate data from the SLC cache to higher density memory cells within the memory device (e.g., memory cells configured as QLC).

Figure 4:
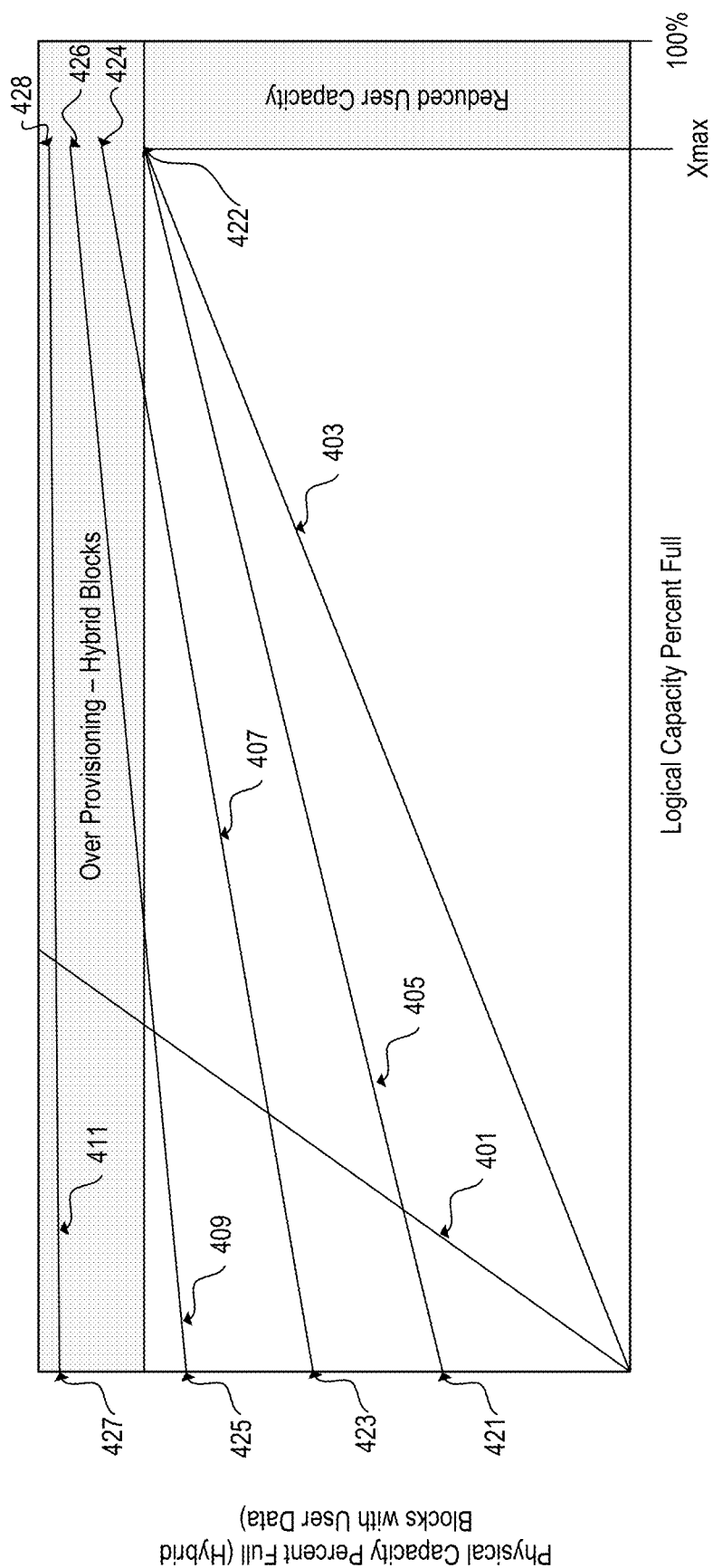
FIG. 4 illustrates an example implementation of the adjustable parameters for write cache replenishment in accordance with some embodiments of the present disclosure.

FIG. 4 illustrates an example implementation of the adjustable parameters for write cache replenishment, in accordance with some embodiments of the present disclosure. FIG. 4 depicts a graph on which the x-axis shows the logical capacity percent full of a memory device and the y-axis shows the physical capacity percent full of the memory device. In this example, the memory device has a number of memory cells configured to various densities. A first block of the memory cells can be configured as SLC, and can be used as an SLC write cache. A second block of the memory cells can be configured as QLC.

The SLC cache capacity is filled along the SLC fill line 401. The QLC capacity is filled along the QLC fill line 403. The SLC fills up four times faster than the QLC because it can hold a quarter of the bits per memory cell. As the SLC fills up along line 401, the data can be migrated to QLC at various points along line 401. The memory sub-system controller and/or the host system can keep track of the logical space used and the physical space used. In this illustrative example, the memory sub-system controller and/or the host system can keep track of an x-y coordinate indicating the logical capacity and the physical capacity used on each memory device. That way, the memory sub-system controller and/or the host system can compare the x-y coordinate of the used capacity levels to the parameter values illustrated in FIG. 4 to determine whether to replenish the SLC write cache.

In certain embodiments, the host system, through parameter adjustment component 123 for example, can determine certain adjustable parameters that define the start and stop thresholds for when the memory sub-system can migrate data from SLC cache to QLC memory. The nine parameters are illustrated in FIG. 4 as 421-428 and Xmax. Xmax can represent the amount of space that is reserved for overprovisioning, or the amount of capacity that is not available to the user.

Parameter 421 can represent the physical capacity percent full value when the logical capacity is empty at which the memory sub-system can begin migrating when the system is idle and running at a nominal temperature. Parameter 422 can represent the physical capacity percent full value when the logical capacity is at full capacity at which the memory sub-system can begin migrating when the system is idle and running at a nominal temperature. Line 405 is drawn by connecting parameter value 421 with parameter value 422, and can represent the capacity criterion (e.g., the x-y coordinate values) at which data can begin migrating from SLC to QLC when the memory device is running at a nominal temperature and the system is idle.

Parameter 423 can represent the physical capacity percent full value when the logical capacity is empty at which the memory sub-system can begin migrating when the system is idle and running at an extreme temperature. Parameter 424 can represent the logical capacity percent full value when the logical capacity is at full capacity at which the memory sub-system can begin migrating when the system is idle and running at an extreme temperature. Line 407 can be drawing by connecting parameter value 423 with parameter value 424, and can represent the capacity criterion (e.g., the x-y coordinate values) at which data can begin migrating from SLC to QLC when the memory device is idle and running at an extreme temperature.

Parameter 425 can represent the physical capacity percent full value when the logical capacity is empty at which the memory sub-system can begin migrating when the system is not idle and running at a nominal temperature. Parameter 426 can represent the logical capacity percent full value when the logical capacity is at full capacity at which the memory sub-system can begin migrating when the system is not idle and running at a nominal temperature. Line 409 can be drawn by connected parameter value 425 and parameter value 426, and can represent the capacity criterion (e.g., the x-y coordinate values) at which data can begin migrating from SLC to QLC when the memory device is not idle and running at a nominal temperature.

Parameter 427 can represent the physical capacity percent full value when the logical capacity is empty at which the memory sub-system can begin migrating when the system is not idle and running at an extreme temperature. Parameter 428 can represent the logical capacity percent full value when the logical capacity is full at which the memory sub-system can begin migrating when the system is not idle and running at an extreme temperature. Line 411 can be drawn by connecting parameter value 427 with parameter value 428, and can represent the capacity criterion (e.g., the x-y coordinate values) at which data can begin migrating from SLC to QLC when the memory device is not idle and running at an extreme temperature.

The range between lines 405 and 407 can represent the capacity at which the SLC will be migrated to QLC if the command queue is empty (i.e., the system is idle), and the range between lines 409 and 411 can represent the capacity at which the SCL will be migrated to QLC if the command queue is not empty (i.e., the system is not idle). For example, if the system is idle, the data can be migrated from SLC to QLC once the SLC capacity reaches the intersection with line 405 if the system is running at a nominal temperature. If the system is idle but is running at an extreme temperature (either very hot or very cold), the memory sub-system can wait to migrate data from SLC to QLC until the SLC capacity reaches line 407. Furthermore, if the system is not idle, the data can be migrated from SLC to QLC once the SLC capacity reaches line 409 if the system is running at a nominal temperature. If the system is not idle and is running at an extreme temperature, the memory sub-system can wait to migrate data from SLC to QLC until the SLC capacity reaches line 411, or is completely full. Because migrating data when the system is not idle requires interrupting the host system's operations in order to execute the data migration, the memory sub-system delays migrating when the system is not idle. Furthermore, migrating data at extreme temperatures can reduce data reliability, hence migrating at extreme temperatures when the system is not idle can be delayed until absolutely necessary, e.g., when the SLC capacity is full.

The host system and/or the memory sub-system can adjust these parameter values (421-428 and Xmax) in order to extend the operational capacity. In determining the parameter values, the host system can take into account historical temperature readings of the memory device and the amount of wear on the media, for example, the number of program/erase (PE) cycles of the memory device. For example, if the memory cells configured as QLC have experienced a high number of PE cycles, the reliability of these memory cells can be reduced. As such, the host system can choose to delay migrating from SLC cache to QLC in order to reduce the number of PE cycles. That is, without altering the parameter values, the data can be migrated from SLC to QLC much sooner or much more frequently than is absolutely necessary, thus wearing down the memory device even further. By adjusting the parameter values to delay migrating, the host system and the memory sub-system can work together to preserve the reliability of the memory cells configured as QLC and extend the life of the memory device. As an example, if the PE cycles are above a certain PE cycle threshold value, the host system can then increase the parameter values 421, 423, 425, and 427 to further delay data migrating.

The host system and/or the memory sub-system can also take into account the historical temperature readings of the memory sub-system when setting the parameter values. For example, the memory sub-system can occasionally (either on a set schedule, e.g., every minute, or upon request from the host) send the host the temperature reading from a thermal sensor connected to the memory device. The host system can track the temperature readings received from the memory sub-system. Based on the tracked temperature readings, the host system can determine that the memory device and/or memory sub-system does not fall below a certain temperature. As such, the host system can adjust the extremely low temperature parameter value accordingly.

For example, the memory sub-system can be within a magnetic resonance imaging (MRI) machine in a hospital. The hospital can be kept a steady temperature range, e.g., may not fall below 5 degrees Celsius and may not rise above 35 degrees Celsius. In a contrasting example, the memory sub-system can be within an all-terrain vehicle used in various field expeditions. The vehicle can experience temperatures as cold as minus 35 degrees Celsius when used in arctic winters, and can experience temperatures as high as 45 degrees Celsius when used in desert summers. To use the same temperature threshold values in both memory sub-systems (the one in the MRI machine and the one in the all-terrain vehicle) would be impractical. As such, the host system and/or the memory sub-system can learn, based on historical temperature readings received from the memory sub-system, the range at which the memory sub-system runs, and can set the parameter values accordingly. Hence, to continue the example, the host system and/or the memory sub-system can set the extreme temperature range for the MRI machine to below 8 degrees Celsius and above 30 degrees Celsius, and can be set the extreme temperature range for the all-terrain vehicle to below minus 20 degrees Celsius and above 40 degrees Celsius.

In some implementations, the parameter values can be set by a human user and inputted into the host system and/or memory sub-system.

Figure 5:
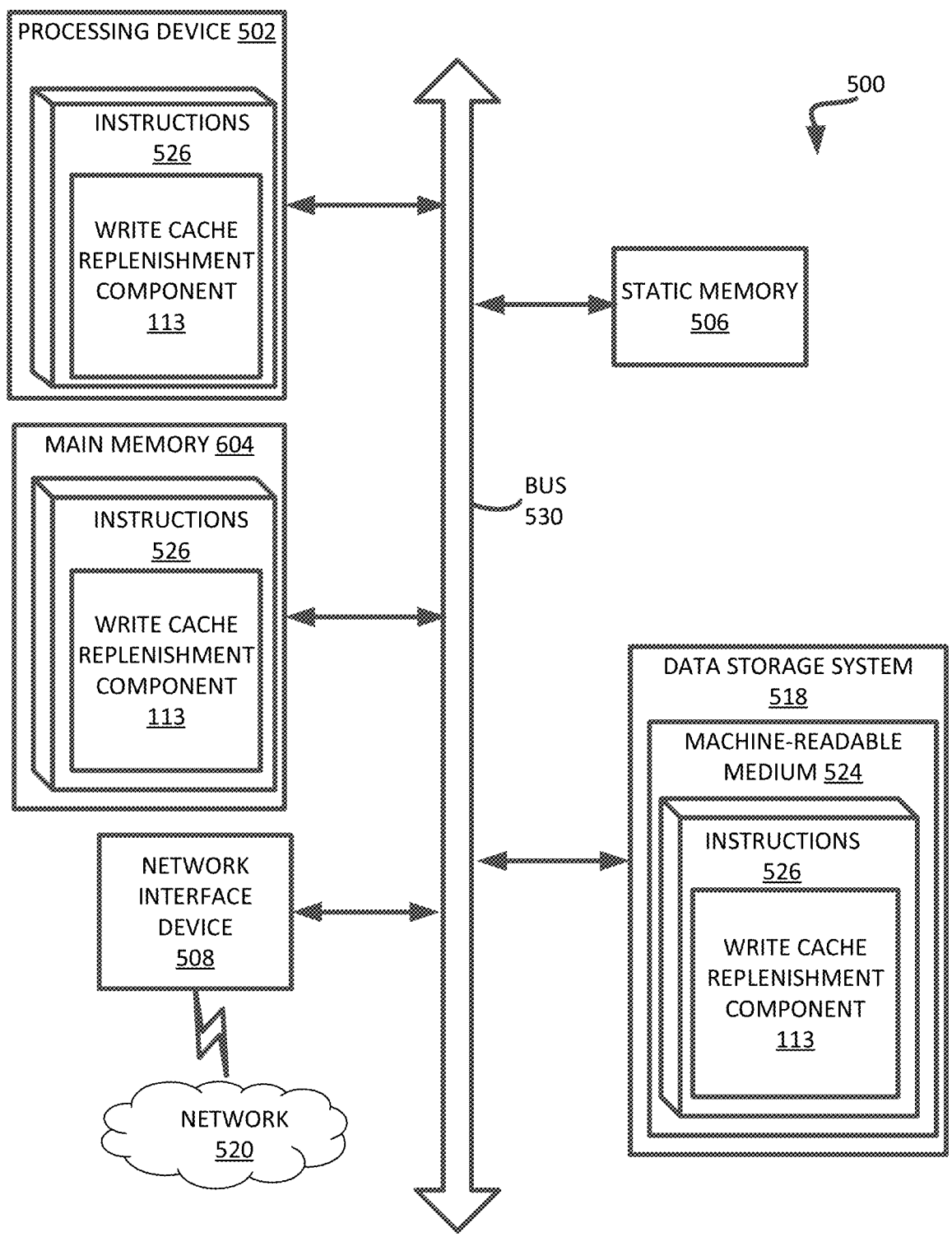
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write cache replenishment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a write cache replenishment component (e.g., the write cache replenishment component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory cells; and
a processing device, operatively coupled with the memory device, to perform operations comprising:
determining a temperature reading from a thermal sensor connected to the memory device;
determining at least one of a logical capacity criterion or a physical capacity criterion based on the temperature reading from the thermal sensor;
responsive to determining that at least one of a logical capacity of a first data block of the plurality of memory cells configured as a first memory type satisfies the logical capacity criterion or a physical capacity of the first data block of the plurality of memory cells configured as the first memory type satisfies the physical capacity criterion, migrating data from the first data block of the plurality of memory cells configured as the first memory type to a second data block of the plurality of memory cells configured as a second memory type; and
responsive to determining that the logical capacity of the first data block of the plurality of memory cells configured as the first memory type does not satisfy the logical capacity criterion and the physical capacity of the first data block of the plurality of memory cells configured as the first memory type does not satisfy the physical capacity criterion, stopping migration of data from the first data block of the plurality of memory cells configured as the first memory type to the second data block of the plurality of memory cells configured as the second memory type.

2. The system of claim 1, wherein the processing device is to perform operations further comprising:
prior to migrating data from the first data block of the plurality of memory cells configured as the first memory type to the second data block of the plurality of memory cells configured as a second memory type, determining whether a command queue associated with the memory device is empty.

3. The system of claim 2, wherein determining the at least one of the logical capacity criterion or the physical capacity criterion based on the temperature reading from the thermal sensor comprises:
responsive to determining that the command queue is empty, determining that the temperature reading from the thermal sensor exceeds a first temperature threshold or is below a second temperature threshold;
setting the logical capacity criterion to a first logical capacity of the first memory type threshold value; and
setting the physical capacity criterion to a first physical capacity of the first memory type threshold value.

4. The system of claim 2, wherein determining the at least one of the logical capacity criterion or the physical capacity criterion based on the temperature reading from the thermal sensor comprises:
responsive to determining that the command queue is not empty, determining that the temperature reading from the thermal sensor exceeds a first temperature threshold or is below a second temperature threshold;

setting the logical capacity criterion to a second logical capacity of the first memory type threshold value; and
setting the physical capacity criterion to a second physical capacity of the first memory type threshold value.

5. The system of claim 1, wherein the logical capacity criterion and the physical capacity criterion are received from a host system.

6. The system of claim 1, wherein determining the at least one of the logical capacity criterion or the physical capacity criterion comprises:
    determining a maximum physical capacity of the memory device;
    determining a maximum logical capacity of the memory device;
    determining the logical capacity criterion based on the maximum logical capacity; and
    determining the physical capacity criterion based on the maximum physical capacity.

7. The system of claim 1, wherein migrating the data from the first data block to the second data block, the processing device is to:
    read the data stored at the first data block; and
    write the data to the second data block.

8. A method comprising:
    receiving a temperature reading from a thermal sensor connected to a memory device;
    determining a number of program/erase (PE) cycles associated with the memory device;
    responsive to determining that the number of PE cycles exceeds a PE cycle threshold value, setting a logical capacity parameter to a logical capacity of a first memory type threshold value and setting a physical capacity parameter to a physical capacity of a first memory type threshold value;
    determining a capacity criterion based on at least one of the temperature reading or the number of PE cycles, wherein the capacity criterion comprises the physical capacity parameter and the logical capacity parameter; and
    transmitting the capacity criterion to a memory sub-system comprising the memory device.

9. The method of claim 8, wherein determining the capacity criterion further comprises:
    responsive to determining that the temperature reading exceeds a first temperature threshold or is below a second temperature threshold, determining whether a command queue associated with the memory device is empty;
    responsive to determining that the command queue is empty, setting the logical capacity parameter to a first logical capacity of the first memory type threshold value and setting the physical capacity parameter to a first physical capacity of the first memory type threshold value; and
    responsive to determining that the command queue is not empty, setting the logical capacity parameter to a second logical capacity of the first memory type threshold value and setting the physical capacity parameter to a second physical capacity of the first memory type threshold value.

10. The method of claim 8, wherein determining the capacity criterion further comprises:
    determining a maximum physical capacity of the memory device;
    determining a maximum logical capacity of the memory device;
    determining the logical capacity parameter based on the maximum logical capacity; and
    determining the physical capacity parameter based on the maximum physical capacity.

11. The method of claim 9, further comprising:
    tracking temperature readings of the memory device;
    determining a maximum temperature and a minimum temperature from the tracked temperature readings;
    setting the first temperature threshold based on the maximum temperature; and
    setting the second temperature threshold based on the minimum temperature.

12. A memory sub-system comprising:
    a memory device comprising a plurality of memory cells, the memory cells comprising a first data block configured as a first memory type and a second data block configured as a second memory type;
    a thermal sensor configured to monitor an operating temperature in the memory sub-system; and
    a processing device, operatively couples with the memory device, to perform operations comprising:
        determining a temperature reading from the thermal sensor;
        determining at least one of a logical capacity criterion or a physical capacity criterion based on the temperature reading from the thermal sensor;
        responsive to determining that at least one of a logical capacity of the first data block of the plurality of memory cells configured as the first memory type satisfies the logical capacity criterion or a physical capacity of the first data block of the plurality of memory cells configured as the first memory type satisfies the physical capacity criterion, migrating data from the first data block of the plurality of memory cells configured as the first memory type to a second data block of the plurality of memory cells configured as a second memory type; and
        responsive to determining that the logical capacity of the first data block of the plurality of memory cells configured as the first memory type does not satisfy the logical capacity criterion and the physical capacity of the first data block of the plurality of memory cells configured as the first memory type does not satisfy the physical capacity criterion, stopping migration of data from the first data block of the plurality of memory cells configured as the first memory type to the second data block of the plurality of memory cells configured as the second memory type.

13. The memory sub-system of claim 12, wherein the processing device is to perform operations further comprising:
    prior to migrating data from the first data block of the plurality of memory cells configured as the first memory type to the second data block of the plurality of memory cells configured as a second memory type, determining whether a command queue associated with the memory device is empty.

14. The memory sub-system of claim 13, wherein determining at least one of a logical capacity criterion or a physical capacity criterion based on the temperature reading from the thermal sensor comprises:
    responsive to determining that the command queue is empty, determining that the temperature reading from the thermal sensor exceeds a first temperature threshold or is below a second temperature threshold;

setting the logical capacity criterion to a first logical capacity of the first memory type threshold value; and setting the physical capacity criterion to a first physical capacity of the first memory type threshold value.

15. The memory sub-system of claim 13, wherein determining at least one of a logical capacity criterion or a physical capacity criterion based on the temperature reading from the thermal sensor comprises:

responsive to determining that the command queue is not empty, determining that the temperature reading from the thermal sensor exceeds a first temperature threshold or is below a second temperature threshold;

setting the logical capacity criterion to a second logical capacity of the first memory type threshold value; and setting the physical capacity criterion to a second physical capacity of the first memory type threshold value.

16. The memory sub-system of claim 12, wherein the logical capacity criterion and the physical capacity criterion are received from a host system.

17. The memory sub-system of claim 12, wherein determining the at least one of the logical capacity criterion or the physical capacity criterion comprises:

determining a maximum physical capacity of the memory device;

determining a maximum logical capacity of the memory device;

determining the logical capacity criterion based on the maximum logical capacity; and determining the physical capacity criterion based on the maximum physical capacity.

* * * * *